(12) United States Patent
Hsieh et al.

(10) Patent No.: US 8,797,731 B2
(45) Date of Patent: Aug. 5, 2014

(54) EXPANSION CARD MOUNTING APPARATUS

(75) Inventors: Kun-Chi Hsieh, New Taipei (TW); Li Tong, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 237 days.

(21) Appl. No.: 13/224,531

(22) Filed: Sep. 2, 2011

(65) Prior Publication Data
US 2012/0228451 A1    Sep. 13, 2012

(30) Foreign Application Priority Data

Mar. 11, 2011   (CN) .......................... 2011 1 0058263

(51) Int. Cl.
G06F 1/16   (2006.01)
H05K 7/14   (2006.01)
G06F 1/18   (2006.01)

(52) U.S. Cl.
CPC ................ *G06F 1/185* (2013.01); *G06F 1/186* (2013.01); *H05K 7/1422* (2013.01)
USPC ...... 361/679.32; 361/732; 361/759; 361/801; 312/223.2

(58) Field of Classification Search
CPC ......... G06F 1/184; G06F 1/185; G06F 1/186; G06F 1/187; H05K 7/1422
USPC .................. 248/225.11, 27.3, 316.6, 222.14; 361/724, 737, 732, 752, 759, 679.32, 361/679.58, 679.6, 801, 805; 312/223.1, 312/223.2; 211/41.17, 41.1, 44
See application file for complete search history.

(56) References Cited

U.S. PATENT DOCUMENTS

| | | | |
|---|---|---|---|
| 6,367,897 B1 * | 4/2002 | Bass et al. .................. | 312/223.2 |
| 6,480,393 B1 * | 11/2002 | Chen .............................. | 361/759 |
| 6,549,398 B2 * | 4/2003 | Chen ........................ | 361/679.58 |
| 6,693,800 B1 * | 2/2004 | Lin et al. ....................... | 361/759 |
| 6,834,766 B2 * | 12/2004 | Lin et al. .................... | 211/41.17 |
| 7,573,704 B2 * | 8/2009 | Chen et al. ............... | 361/679.32 |
| 7,753,458 B2 * | 7/2010 | Liang et al. ................ | 312/223.2 |

* cited by examiner

*Primary Examiner* — Tan Le
(74) *Attorney, Agent, or Firm* — Novak Druce Connolly Bove + Quigg LLP

(57) ABSTRACT

An expansion card mounting apparatus includes a side wall, a support plate, a slot cover, and a retaining member. The side wall defines an expansion card slot. The support plate is connected to the side wall and located above the expansion card slot. The slot cover includes a cover body, a fixing portion extending from the cover body, and a plurality of contact points extending from the cover body. The slot cover covers the expansion card slot with the fixing portion contacting the support plate and the plurality of contact points contacting the side wall. The retaining member includes a main body and a pressing plate connected to the main body. The main body is secured on the side wall. The pressing plate is located on the fixing portion to fix the fixing portion between the pressing plate and the support plate.

9 Claims, 4 Drawing Sheets

EXPANSION CARD MOUNTING APPARATUS

BACKGROUND

1. Technical Field

The present disclosure relates to mounting apparatuses, and more particularly to a mounting apparatus for mounting expansion cards in a computer enclosure.

2. Description of Related Art

A computer system usually includes expansion cards for enhancing capabilities of the computer system, such as sound cards, video cards, and graphics cards. The expansion cards are often fixed in the computer system with screws. However, using screws to fix the expansion cards is very laborious and time-consuming.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
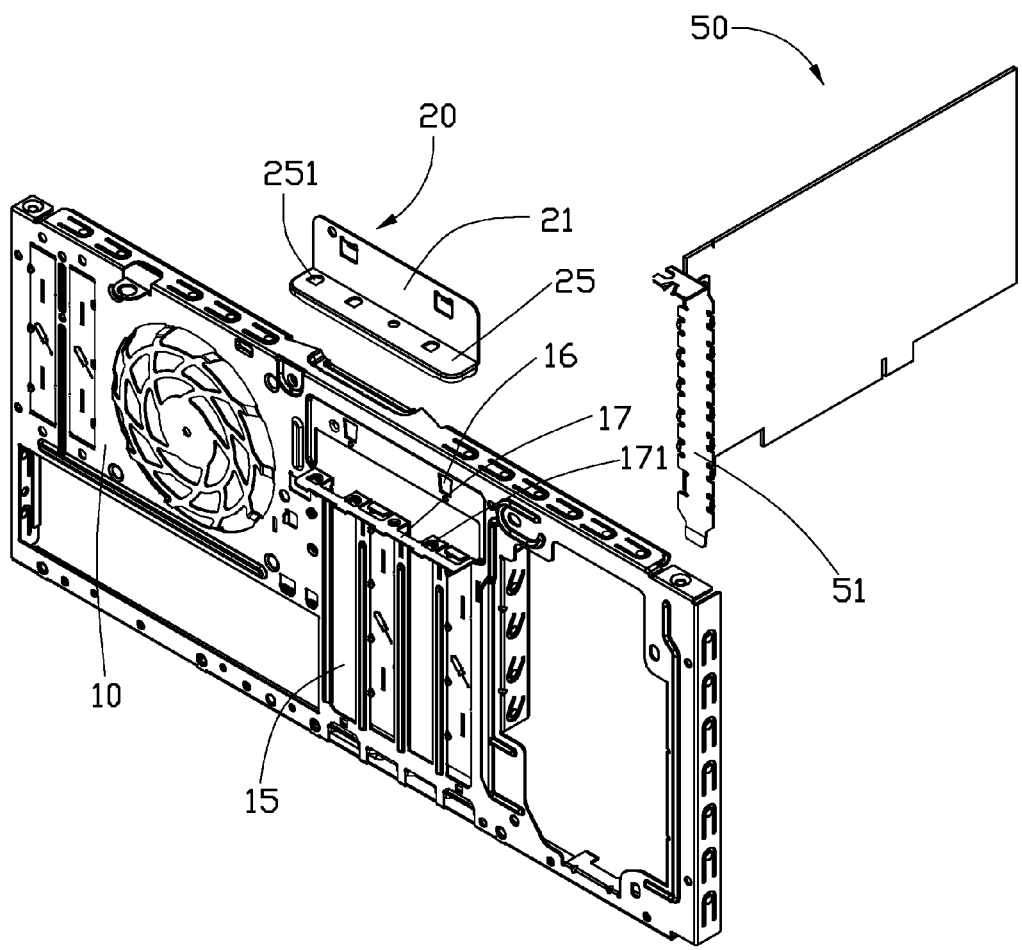
FIG. 1 is an isometric and exploded view of an expansion card mounting apparatus.
Figure 2:
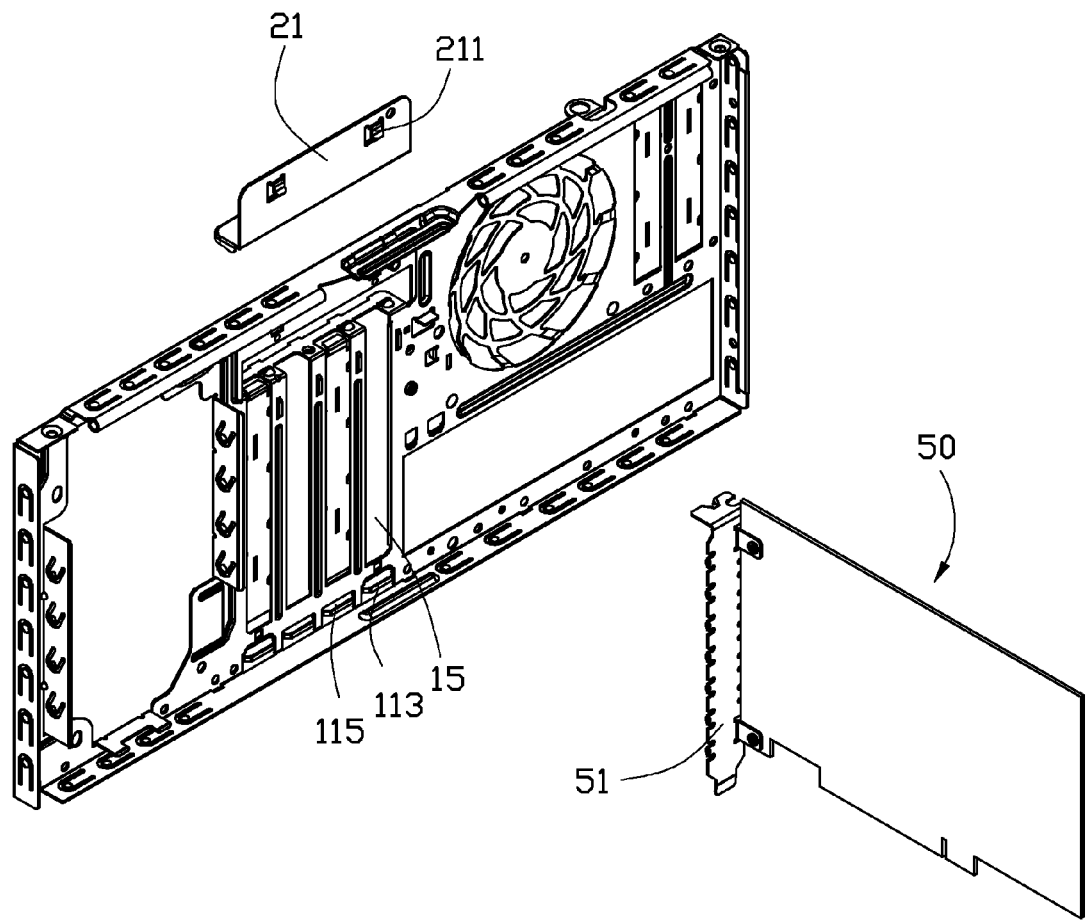
FIG. 2 is similar to FIG. 1, but viewed from another aspect.

Referring to FIGS. 1 and 2, one embodiment of an expansion card mounting apparatus includes a side wall 10 for mounting one or more expansion cards 50 and a horizontal support plate 17 connected to a portion of the side wall 10.

The horizontal support plate 17 can be formed by stamping a portion of the side wall 10. Juxtaposed and vertical expansion card slots 15 are defined in the side wall 10. The support plate 17 is located above the expansion card slots 15. The support plate 17 comprises a plurality of bosses 171 corresponding to the plurality of expansion card slots 15. The side wall 10 includes a plurality of bridge pieces 113. Each bridge piece 113 is located below an expansion card slot 15. A receiving space 115 is surrounded by the bridge piece 113. The side wall 10 defines a pair of engaging holes 16. The pair of engaging holes 16 is located above the support plate 17.

A retaining member 20 is mounted on the side wall 10. The retaining member 20 includes a main body 21, and a horizontal pressing plate 25 perpendicularly bent from one longitudinal edge of the main body 21. The pressing plate 25 defines a plurality of spaced receiving holes 251. A pair of clips 211 is formed on the main body 21.

Figure 3:
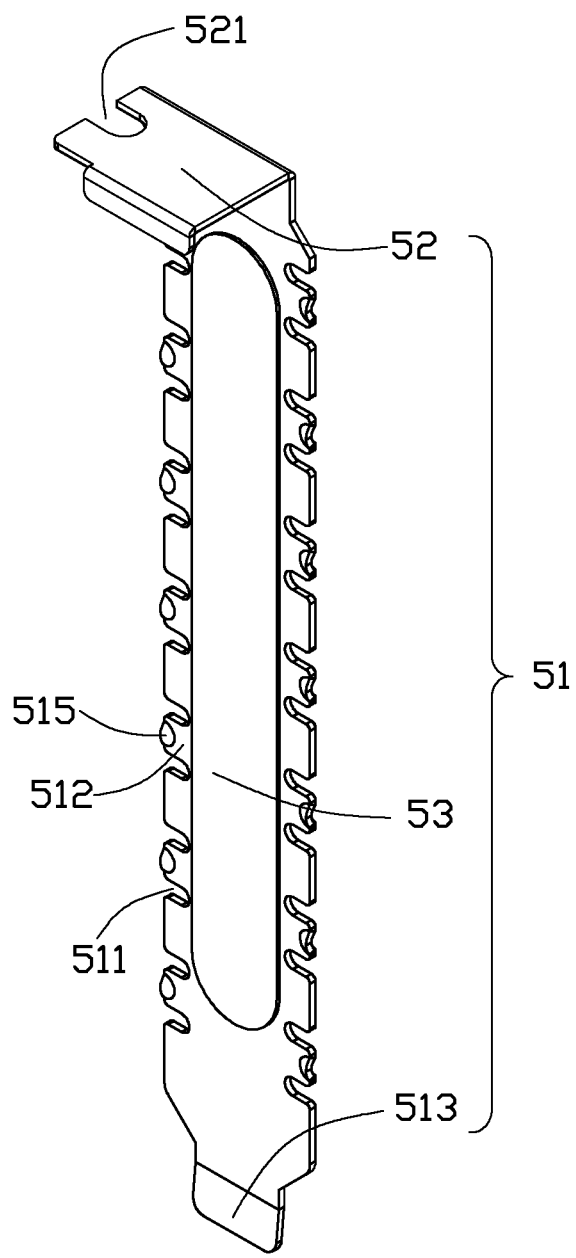
FIG. 3 is an isometric view of a slot cover of FIG. 1.
Figure 4:
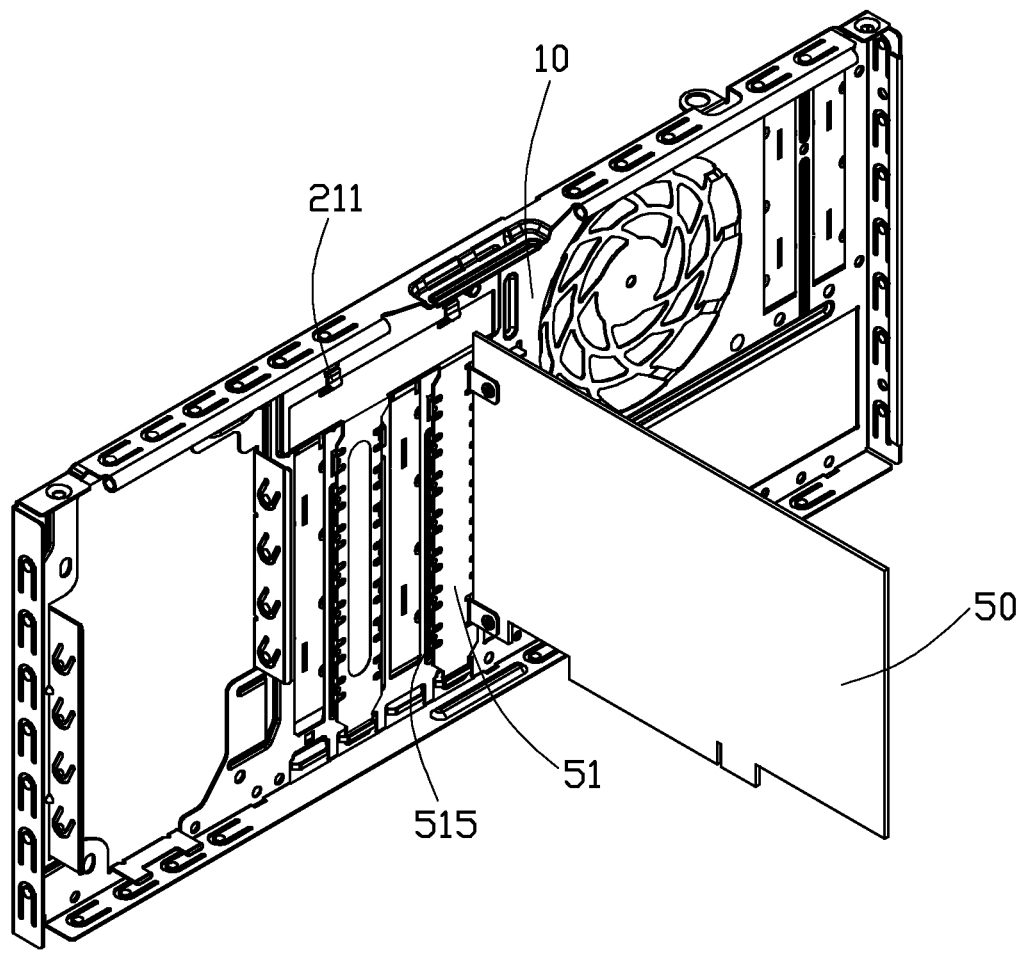
FIG. 4 is an isometric and assembled view of the expansion card mounting apparatus of FIG. 1.

Referring to FIGS. 1 and 3, an edge of the expansion card 50 is mounted with a slot cover 51. The slot cover 51 includes a cover body 53, a bent fixing portion 52 extending from a top end of the cover body 53, and a narrow insert portion 513 extending from a bottom end of the cover body 53. A recess 521 is defined in the fixing portion 52. The slot cover 51 defines a plurality of spaced cutouts 511 on opposite edges of the cover body 53. The cover body 53 includes a contact piece 512 formed between each two adjacent cutouts 511. Each contact piece 512 has a protruding contact point 515.

Referring to FIGS. 1 to 4, in assembly, the expansion card 50 is moved towards the side wall 10. The insert portion 513 is inserted into a receiving space 115. The slot cover 51 covers on corresponding slot 15. The fixing portion 52 is located on the support plate 17 with the boss 171 received in the recess 521. At this position, the contact points 515 contact the side wall 10 for shielding EMI. Then, the pressing plate 21 is located on the fixing portion 52 to press the fixing portion 52 on the support plate 17. The bosses 171 are received in the receiving holes 251. The clips 211 are secured in the engaging holes 16 to fix the retaining member 20 on the side wall 10.

It is to be understood, however, that even though numerous characteristics and advantages of the embodiments have been set forth in the foregoing description, together with details of the structure and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An expansion card mounting apparatus, comprising:
   a side wall defining an expansion card slot;
   a support plate connected to a portion of side wall and located above the expansion card slot;
   a slot cover comprising a cover body, a fixing portion extending from the cover body, and a plurality of contact points extending from the cover body, wherein the slot cover covers the expansion card slot with the fixing portion contacting the support plate and the plurality of contact points contacting the side wall; and
   a retaining member comprising a main body and a pressing plate connected to the main body, wherein the main body is secured on the side wall, and the pressing plate is located on the fixing portion to fix the fixing portion between the pressing plate and the support plate;
   wherein the pressing plate defines a receiving hole, a recess is defined in the fixing portion, and the support plate comprises a boss inserted in the recess and the receiving hole in succession.

2. The expansion card mounting apparatus of claim 1, wherein the slot cover defines a plurality of spaced cutouts on opposite edges of the cover body, the cover body of the slot cover forms a plurality of contact pieces, wherein a contact piece is located between two adjacent cutouts, and the plurality of contact points protrudes from the contact pieces.

3. The expansion card mounting apparatus of claim 1, wherein the slot cover further comprises a narrow insert portion, the side wall comprises a bridge piece which is located below the expansion card slot, a receiving space is surrounded by the bridge piece, and the narrow insert portion is received in the receiving space.

4. The expansion card mounting apparatus of claim 1, wherein the sidewall further defines a pair of engaging holes, and the main body comprises a pair of clips secured in the pair of engaging holes.

5. An expansion card mounting apparatus, comprising:
   a side wall defining an expansion card slot, the side wall comprising a bridge piece which is located below the expansion card slot, a receiving space surrounded by the bridge piece;

a support plate connected to a portion of the side wall and located above the expansion card slot; and a slot cover comprising a cover body, a fixing portion connected to a top end of the cover body, and a narrow insert portion connected to a bottom end of the cover body, a plurality of contact points extending out of a plane of the cover body; wherein the slot cover covers the expansion card slot with the fixing portion contacting the support plate and the plurality of contact points contacting the side wall, and the narrow insert portion is retained in the receiving space; and a retaining member, wherein the retaining member comprises a main body and a pressing plate connected to the main body, the main body is secured on the side wall, and the pressing plate is located on the fixing portion to fix the fixing portion between the pressing plate and the support plate.

6. The expansion card mounting apparatus of claim 5, wherein a boss is located on the support plate, the pressing plate defines a receiving hole, and the boss is retained in the receiving hole.

7. The expansion card mounting apparatus of claim 6, wherein a recess is defined in the fixing portion, and the boss is received in the recess.

8. The expansion card mounting apparatus of claim 5, wherein the sidewall further defines a pair of engaging holes, and the main body comprises a pair of clips secured in the pair of engaging holes.

9. The expansion card mounting apparatus of claim 5, wherein the slot cover defines a plurality of spaced cutouts on opposite edges of the cover body, the cover body forms a plurality of contact pieces wherein a contact piece is located between two adjacent cutouts, and the plurality of contact points protrudes from the contact pieces.

* * * * *